(12) United States Patent
Takagi

(10) Patent No.: US 7,576,423 B2
(45) Date of Patent: Aug. 18, 2009

(54) SEMICONDUCTOR DEVICE

(75) Inventor: Kazutaka Takagi, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/137,620

(22) Filed: Jun. 12, 2008

(65) Prior Publication Data

US 2008/0246140 A1 Oct. 9, 2008

Related U.S. Application Data

(62) Division of application No. 11/317,024, filed on Dec. 27, 2005, now Pat. No. 7,411,288.

(30) Foreign Application Priority Data

Dec. 28, 2004 (JP) ............................. 2004-381897

(51) Int. Cl.
    *H01L 23/48* (2006.01)
(52) U.S. Cl. ............................. 257/699; 257/E23.184
(58) Field of Classification Search ......... 257/678–690,
                          257/698–699, E23.184; 361/699, 764
    See application file for complete search history.

(56) References Cited

U.S. PATENT DOCUMENTS

| 6,956,283 | B1 * | 10/2005 | Peterson | 257/680 |
|---|---|---|---|---|
| 7,005,720 | B2 * | 2/2006 | Huang et al. | 257/433 |
| 7,091,594 | B1 | 8/2006 | Kim et al. | |
| 7,274,094 | B2 * | 9/2007 | Boon et al. | 257/680 |
| 2003/0000737 | A1 * | 1/2003 | Liu et al. | 174/256 |
| 2003/0218240 | A1 * | 11/2003 | Cho | 257/680 |
| 2004/0046247 | A1 | 3/2004 | Tower | |

FOREIGN PATENT DOCUMENTS

| JP | 4-373155 | 12/1992 |
|---|---|---|
| JP | 2004-247514 | 9/2004 |

* cited by examiner

*Primary Examiner*—Nathan W Ha
(74) *Attorney, Agent, or Firm*—Oblon, Spivak, McClelland, Maier & Neustadt, P.C.

(57) ABSTRACT

A frame-shaped sidewall is provided on a metallic base plate surrounding a semiconductor element arranged on the metallic base plate, a first dielectric plate is arranged on one side of the semiconductor element and a first circuit pattern is formed on its surface, a second dielectric plate is arranged on another side of the semiconductor element and a second circuit pattern is formed and the first and the second dielectric plate. Power supply portions are provided on a part of the sidewall, through which a first or a second band-shaped conductors is penetrating. A relay post is provided on the dielectric plate. The first band-shaped conductor is connected to the circuit pattern by an interconnection via the relay post.

6 Claims, 3 Drawing Sheets

SEMICONDUCTOR DEVICE

CROSS-REFERENCE TO RELATED APPLICATIONS

This application is a division of and claims the benefit of priority under 35 U.S.C. §120 from U.S. application Ser. No. 11/317,024, filed Dec. 27, 2005, and claims the benefit of priority under 35 U.S.C. §119 from Japanese Patent Application No. 2004-381897, filed on Dec. 28, 2004, the entire contents of which are incorporated herein by reference.

BACKGROUND TECHNOLOGY OF THE INVENTION

The present invention relates to a semiconductor device used, for example, in a high frequency band.

A microwave power amplifier using semiconductor device for the high frequency (hereinafter referred to as HF) band, using a gallium arsenide field effect transistor (hereinafter referred as GaAsFET), for example, is assembled in a package which is so constructed that a frame-shaped metallic sidewall is provided on a base plate, an opening formed by the sidewall on an upper portion is covered with a metallic lid. In this package, an input matching circuit is arranged on an input side of the GaAs FET and an output matching circuit is arranged on an output side of the GaAs FET. These matching circuits are formed on a dielectric plate fixed on the base plate.

A part of the metallic sidewall adjacent to the input matching circuit is composed of an insulator such as ceramic and a band-shaped conductor for an input signal is provided penetrating through the sidewall formed by the insulator. One end of an input lead wire, which is lead out from the package, is connected with one end of the band-shaped conductor. A wire, which is connected with an input end of the input matching circuit in the package, is connected with the other end of the input band-shaped conductor by bonding.

A part of the metallic sidewall adjacent to the output matching circuit is similarly composed of an insulator and a band-shaped conductor for an output signal is provided penetrating through the sidewall formed by the insulator. One end of an output lead wire, which is lead out from the package, is connected with one end of the band-shaped conductor for an output signal. A wire, which is connected with an input end of the input matching circuit in the package, is connected with the other end of the input band-shaped conductor by bonding.

The output end of the input matching circuit is connected to the input end of the GaAs FET by wire bonding and the output end of the GaAsFET is connected to the input end of the output matching circuit by wire bonding. In the microwave power amplifier thus composed, input signals received by the input lead wire is supplied to the input end of the input matching circuit inside the package via input band-shaped conductor. Input signals, converted by the input matching circuit are supplied to the input end of the GaAsFET to be amplified. Output signals from the GaAsFET are lead out of the package via output matching circuit and the output band-shaped conductor, and are outputted through the output lead wire.

Such microwave power amplifier is disclosed, for example, in Japanese patent disclosure H9-153839.

Recently, a demand is arising for a high output power for such conventional semiconductor device as disclosed above. Consequently, durability of the band-shaped conductor, which penetrates through the sidewall portion of the package, against interrupting with a high current is required. Namely capability to a high current interrupting is required. To achieve the tolerance to a high current interrupting, there is a method for increasing a thickness of the band-shaped conductor, for example. However, if the thickness of the band-shaped conductor is increased, following problems arise.

The band-shaped conductor penetrating through the sidewall portion is sealed by a pair of insulator members such as ceramic members, for example, provided on and under the band-shaped conductor jointly forming a portion of the sidewall. Therefore, joining of the pair of ceramic members becomes difficult and hermetic seal of the portion where the band-shaped conductor is penetrating is degraded, if the thickness of the band-shaped conductor is increased. As the result, it becomes difficult to keep air tightness of the package in which the semiconductor elements and other elements are sealed. For the above reasons, there exists a limit in the thickness of the band-shaped conductor.

There is another method to achieve the capability to a high current interrupting, in which a width of the band-shaped conductor, namely a width of a pattern is broadened, for example. To make the width of the pattern broad, the thickness of the sidewall portion between the band-shaped conductor and the surface of the baseboard, made of the ceramic, for example, should be made thicker in order to keep predetermined impedance. When the ceramic is made thicker, difference in the height becomes great between the circuit pattern composing the input matching circuit or output matching circuit and the band-shaped conductor. As the result, wires connecting circuit pattern and band-shaped conductor become long in vertical direction, for example, radiation loss increases. Further, if difference in the height becomes large between circuit pattern and band-shaped conductor, problems arise that a discontinuity arises in the path of HF current and reflection occurs at the portion.

SUMMARY OF THE INVENTION

The semiconductor device according to an aspect of the present invention includes a metallic base plate, a semiconductor element arranged on the base plate, a first dielectric plate having a surface, on which a circuit pattern is formed and arranged on the base plate on one side of the semiconductor element, a frame-shaped sidewall provided on the base plate surrounding these first dielectric plate and the semiconductor element, a power supply portion including insulator forming a part of the sidewall, a band-shaped conductor provided penetrating through the power supply portion at a higher position than the surface of the first dielectric plate with respect to a main surface of the base plate, and a relay post provided on the first dielectric plate, wherein the relay post further includes an insulator block, at a center portion of which a VIA hole is formed in the vertical direction, a VIA metal filled in the VIA hole of the insulator block, a lower end of which is connected with the circuit pattern formed on the first dielectric plate and upper end of which is extended to a higher position than the surface of the first dielectric plate, and a conductor layer provided on the surface of the insulator block surrounding the VIA metal, and wherein the first band-shaped conductor is connected with the first circuit pattern mutually by an interconnection via the relay post.

DETAILED DESCRIPTION OF THE INVENTION

Figure 1A:
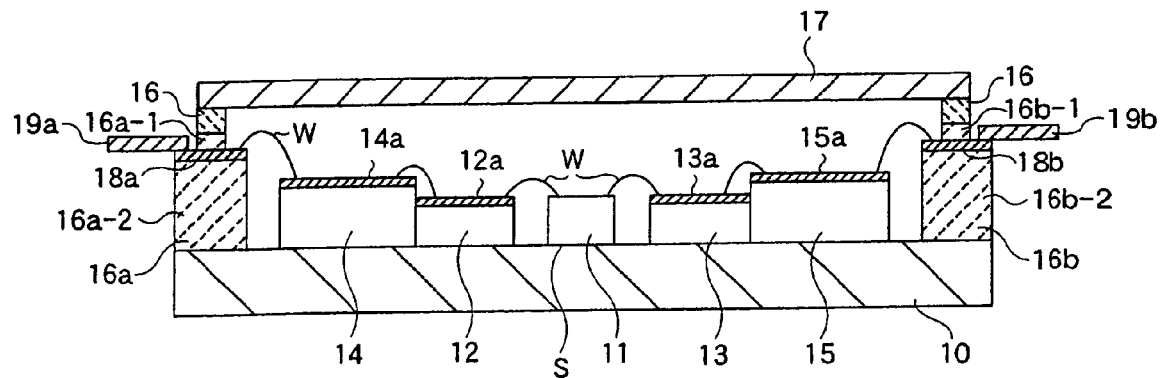
FIG. 1A is a cross sectional view showing an embodiment of the present invention.

An embodiment of the present invention will be explained using a semiconductor device using a GaAs FET as an example referring to FIG. 1A.

A semiconductor element 11, for example a GaAs FET for power amplification, is arranged on a metallic base plate 10. A first dielectric plate 12 is arranged on an input side of the semiconductor element 11 and a second dielectric plate 13 is arranged on an output side of the semiconductor element. On the first dielectric plate 12, a first circuit pattern 12a is formed. On the second dielectric plate 13, a second circuit pattern 13a is formed. In the vicinity of the first dielectric plate 12, a third dielectric plate 14 having a thickness thicker than the first dielectric plate 12 is arranged. In the vicinity of the second dielectric plate 13, a fourth dielectric plate 15 having a thickness thicker than the second dielectric plate 13 is arranged. On the third dielectric plate 14 and the fourth dielectric plate 15, line conductors 14a and 15a composing micro strip line conductor are formed.

On the base plate 10, a rectangular frame-shaped sidewall 16 is formed with a predetermined height surrounding the semiconductor element 11, the first dielectric plate 12, the second dielectric plate 13, the third dielectric plate 14 and the fourth dielectric plate 15. A major portion of the sidewall 16 is composed of metal, for example, other than a few portions. A metallic lid seals a rectangular opening formed on the upper portion of the sidewall 16. A package is thus composed of the base plate 10, the rectangular frame-shaped sidewall 16 and the metallic lid 17.

Figure 1B:
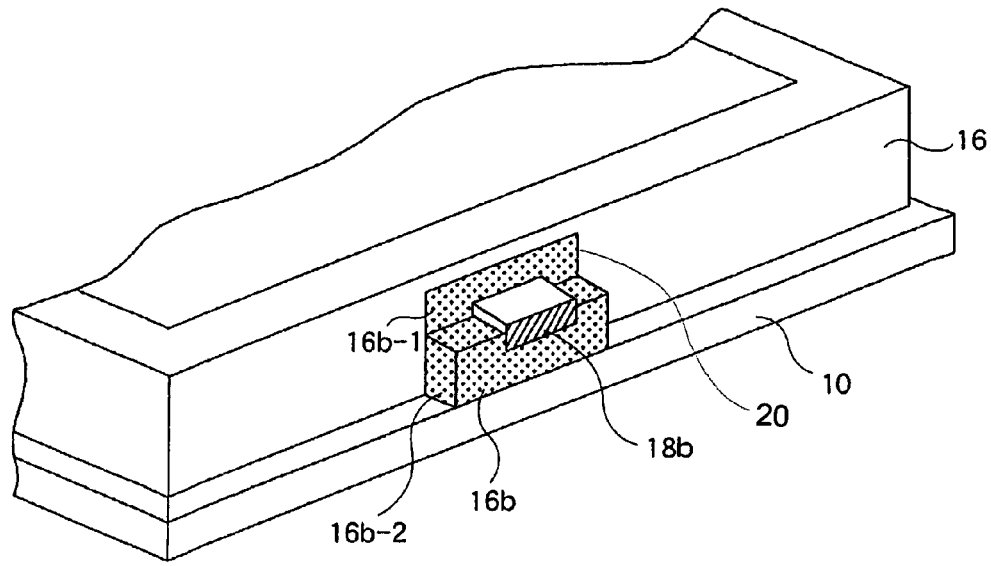
FIG. 1B is an enlarged perspective view showing a part of FIG. 1A.

On a part of a pair of opposing sides of the rectangular frame-shaped sidewall 16, an input side power supply portion 16a and an output power supply portion 16b are provided, each of which is composed of insulator. FIG. 1B is a perspective view showing the output side power supply portion 16b together with a part of package including the output side of the rectangular frame-shaped sidewall 16. As shown in the figure, the output side power supply portion 16b hermetically fills a pair of vertically laminated ceramic plates 16b-1, 16b-2 in a rectangular notch portion 20 formed on the middle and lower portion of the sidewall 16 composing the output side. A band-shaped conductor for output signal 18b is pinched between upper and lower ceramic plates 16b-1 and 16b-2, and thus the package is sealed airtight by joining the upper and lower ceramic plate 16b-1, 16b-2 mutually. Here, the lower ceramic plate 16b-2 is formed longer than the upper ceramic plate 16b-1, the end portion of which is exposed outside the sidewall 16. The input side power supply portion 16a has a similar construction though it is not illustrated. On these power supply portions, a band-shaped conductor for input signal 18a and a band-shaped conductor for output signal 18b are provided to penetrate the power supply portions. The band-shaped conductor for input signal 18a and the band-shaped conductor for output signal 18b penetrate the input side power supply portion 16a and the output side power supply portion 16b at a position higher than the line conductor 14a or the line conductor 15a with respect to a height of a flat main surface S of the base plate 10. An input lead wire 19a is connected with the band-shaped conductor for input signal 18a. While, an output lead wire 19b is connected with the band-shaped conductor for output signal 18b. One end of the band-shaped conductor for input signal 18a and the band-shaped conductor for output signal 18b are exposed outside the package together with the ceramic plate 16b-1 and 16b-2 under the input side power supply portion 16a and the output side power supply portion 16b. The input lead wire 19a and the output lead wire 19b are connected with these exposed portions.

In the package, on the other hand, there are provided wires W, which respectively make electric connections between the input band-shaped conductor 18a and line conductor 14a, between the line conductor 14a and the first circuit pattern 12a, between the first circuit pattern 12a and the semiconductor element 11, between the semiconductor element 11 and the second circuit pattern 13a, between the second circuit pattern 13a and the line conductor 15b, and between the line conductor 15b and the output band-shaped conductor 18b.

With the semiconductor device thus constructed, an input signal introduced from the input band-shaped conductor 18a is supplied to the semiconductor element 11 through the line conductor 14a and the first circuit pattern 12a and is amplified. An output signal amplified by the semiconductor element 1 is obtained at the output band-shaped conductor 18b through the second circuit pattern 13a and the line conductor 15b.

With the semiconductor device, a third dielectric plate 14 is arranged between the first dielectric plate 12 and the input power supply portion 16a. A fourth dielectric plate 15 is arranged between the second dielectric plate 12 and the output power supply portion 16b. The line conductor 14a on the third dielectric plate 14 is positioned at a level higher than the first circuit pattern 12a on the first dielectric plate 12 and at a level lower than the input band-shaped conductor 18a, which penetrates the input power supply portion 16a of the sidewall 16, with respect to the main surface S of the base plate 10. Similarly, the line conductor 15a on the fourth dielectric plate 15 is positioned at a level higher than the second circuit pattern 13a on the second dielectric plate 13 and at a level lower than the output band-shaped conductor 18b, which penetrates the output power supply 16b of the sidewall 16.

Therefore, the difference in the height between the circuits to be connected by the wire is decreased, if the width of the input and output band-shaped conductor 18a, 18b is broadened in order to provide the tolerance to a high current and the sidewall 16 between the band-shaped conductor 18a, 18b and the base plate 10 becomes thick, which makes the height of the band-shaped conductor 18a and 18b at the penetrating portion high. As the result, impedance variation between the circuits to be connected by the wire is decreased and thus a semiconductor device having the least radiation loss is obtained.

In the embodiment mentioned above, a dielectric plate 14 is arranged between the first dielectric plate 12 and the input power supply portion 16a in order to minimize the height difference between the circuits to be connected with wire. However, a plurality of dielectric plates with different heights can be arranged in order to make the difference the in height between the circuits to be connected by the wire further less. This is true with respect to the dielectric plate 15 arranged with the second dielectric plate 13 and the output power supply 16b.

Figure 2:
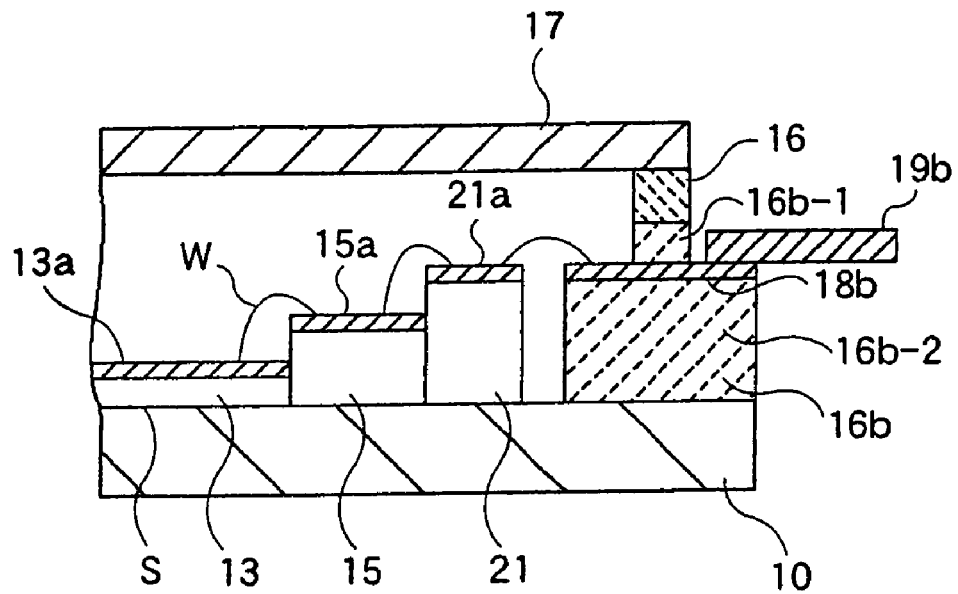
FIG. 2 is a cross sectional view showing another embodiment of the present invention.

Next, a semiconductor device according to the second embodiment of the present invention is explained referring to FIG. 2. The semiconductor device of the embodiment has a structure in which the input and output side are substantially symmetrical with a semiconductor element (not illustrated) similar to the semiconductor device shown in FIG. 1. FIG. 2 is a cross section showing only the output side portion of the semiconductor device. In this figure, parts corresponding to the parts of the semiconductor device shown in FIG. 1 are assigned with the same symbols and some duplicated explanations are omitted.

In the embodiment, a fifth dielectric plate 21 with a line conductor 21a on its surface is arranged between the fourth dielectric plate 15 and the band-shaped conductor 18b. The fifth dielectric plate 21 has a thickness the surface of which is positioned at substantially the same height as the band-shaped conductor 18b with respect to the main surface S of the base plate 10.

In the neighborhood of the output power supply portion 16b where the band-shaped conductor 18b penetrates the sidewall 16, namely at outside or inside portion of the sidewall 16 or at the penetrating portion of the band-shaped conductor 18b, a structure of the line conductor along the band-shaped conductor 18b varies in such manner that it has the sidewall with or no sidewall with. Therefore, the impedance is apt to vary, making a stable transmission of a signal difficult. However, a dielectric plate 21 on which a line conductor 21a is provided having the same height as the band-shaped conductor 18b is arranged adjacent to the band-shaped conductor 18b in the present embodiment. Therefore, the difference in the height between the circuits to be connected by the wire is no longer exist in the neighborhood of the band-shaped conductor 18b where the impedance is apt to vary, and thus infection on the transmitting signal can be minimized.

Here, the above-mentioned construction can be employed in the input portion of the semiconductor device because of the symmetric structure.

Figure 3:
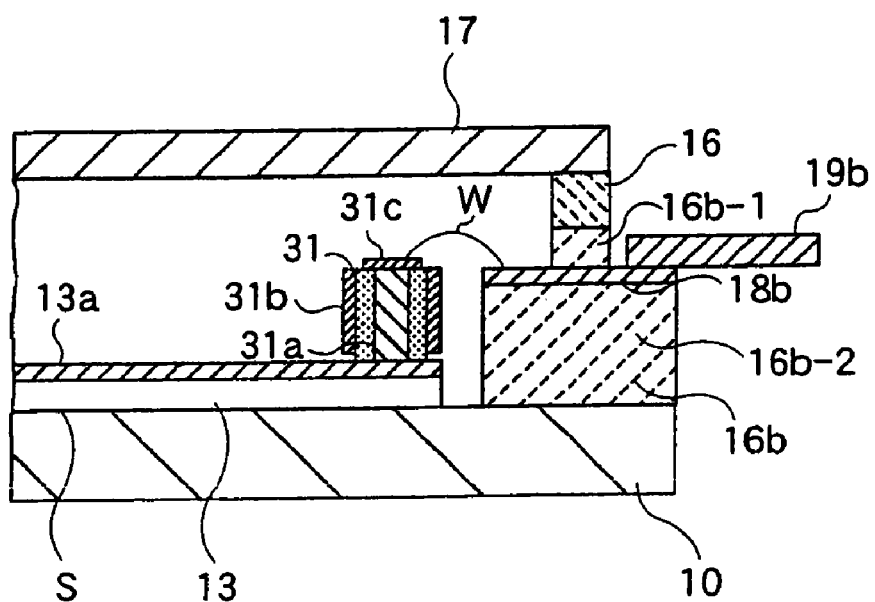
FIG. 3 is a cross sectional view showing a further different embodiment of the present invention.

A semiconductor device according to the third embodiment of the present invention is explained referring to FIG. 3. The semiconductor device of the embodiment has a substantially symmetric structure of the input and output side with respect to the semiconductor element (not illustrated), which is similar to the semiconductor device shown in FIG. 1 or in FIG. 2. FIG. 3 is a cross sectional view showing only the output side portion of the semiconductor device. In this figure, parts corresponding to those of the semiconductor device shown in FIG. 1 are assigned with the same symbols and duplicated explanations are omitted.

In this embodiment, an insulator block 31 is arranged on the end portion adjacent to the band-shaped conductor 18b on the second dielectric plate 13. On the insulator block 31, a VIA hole 31a, which is a through hole, is formed and a conduction layer 31b is formed on side surfaces surrounding the VIA hole 31a. On the insulator block 31, a conducting pattern 31c, which is connected with the VIA hole 31a is formed and the conduction pattern 31c and band-shaped conductor 18b are connected with other by a wire W.

The insulator block 31 has a same height as the penetrating portion of the band-shaped conductor 18b, so as to make no difference in the height between the conduction pattern 31c and the band-shaped conductor 18b, for example. Alternatively, the insulator block 31 may have less height, and accordingly the position of conduction pattern 31c may be a little bit lower than the penetrating portion of the band-shaped conductor 18b.

With the structure mentioned above, the band-shaped conductor 18b is connected with the circuit pattern 13a provided on the insulator block 31 through the VIA hole 31a and the conduction layer 31b is formed surrounding the VIA hole 31b. Therefore, the radiation loss at the VIA hole 31a portion can be decreased. Further, the impedance of the VIA hole 31a portion can be adjusted appropriately by changing the shape of VIA hole 31a such as the diameter of the through hole, for example.

Here, the above-mentioned structure can be adapted to the input side of the semiconductor device due to the symmetric structure.

Figure 4:
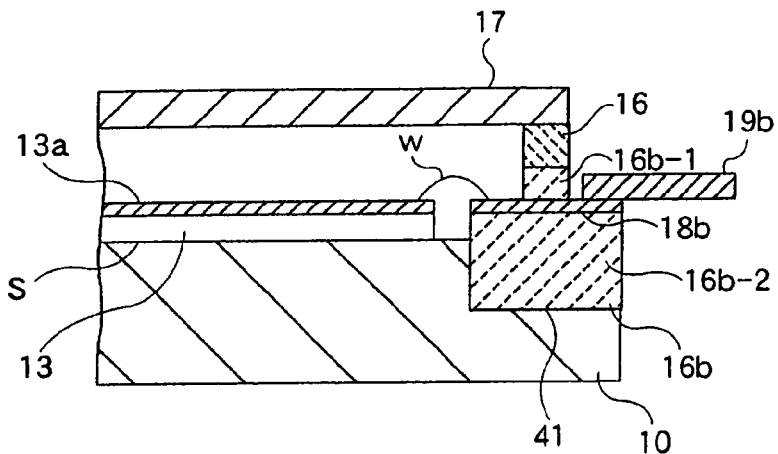
FIG. 4 is a cross sectional view showing a further different embodiment of the present invention.

The fourth embodiment of the present invention will be explained referring to FIG. 4. The semiconductor device of the embodiment has a substantially symmetric structure of the input and output side with respect to the semiconductor element (not illustrated), which is similar to the semiconductor device shown in FIG. 1. FIG. 4 is a cross section showing only the output portion of the semiconductor device. In this figure, parts corresponding to the parts of the semiconductor device shown in FIG. 1 are assigned with the same symbols and duplicated explanations are omitted.

In this embodiment, a stepped surface 41 lower than the main surface S is provided on a part of the base plate 10. A sidewall 16 is formed on the stepped surface 41 to make the height of the circuit pattern 13a equal to the height of the band-shaped conductor 18b.

Also with the structure, forming the sidewall 16 on the step surface 41 can decrease the difference in the height of the circuits to be connected with each other by a wire W and the same advantage as the embodiment mentioned above can be obtained.

Figure 5:
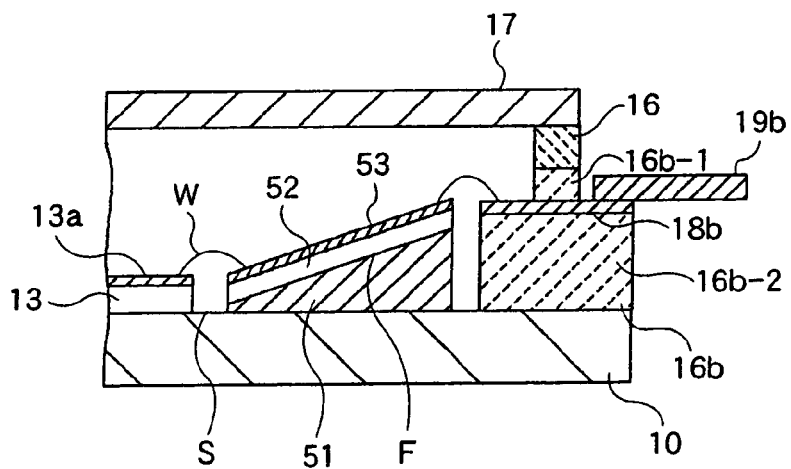
FIG. 5 is a cross sectional view showing a further different embodiment of the present invention.

The fifth embodiment of the present invention will be explained referring to FIG. 5. The semiconductor device according to the embodiment has a substantially symmetric structure of the input and output side with respect to the semiconductor element (not illustrated), which is similar to the semiconductor device shown in FIG. 1. FIG. 5 is a cross section showing only the output portion of the semiconductor device. In this figure, parts corresponding to the parts of the semiconductor device shown in FIG. 1 are assigned with the same symbols and duplicated explanations are omitted.

In this embodiment, a metal block 51 having an inclined surface F is provided on the base plate 10 between the second dielectric plate 13 and the band-shaped conductor 18b. The inclined surface F is low on the second dielectric plate 13 side and is high on the band-shaped conductor 18b side with respect to a main surface S of the base plate 10. A second dielectric plate 52 is provided on the inclined surface F of the metal block 51 and a line conductor pattern 53 is provided on the second dielectric plate.

Also in the structure mentioned above, the line conductor pattern 53 formed on the metal block 51 is gradually lowering from the band-shaped conductor 18b side to the second dielectric plate 13. Therefore, the difference in the height between the circuits to be connected by the wire W decreases, so that the similar advantages in the embodiments mentioned above can be obtained.

Processing the surface of the base plate 10 may form the metal block 51 or a metal block 51 formed separately may be joined on the base plate 10.

Figure 6:
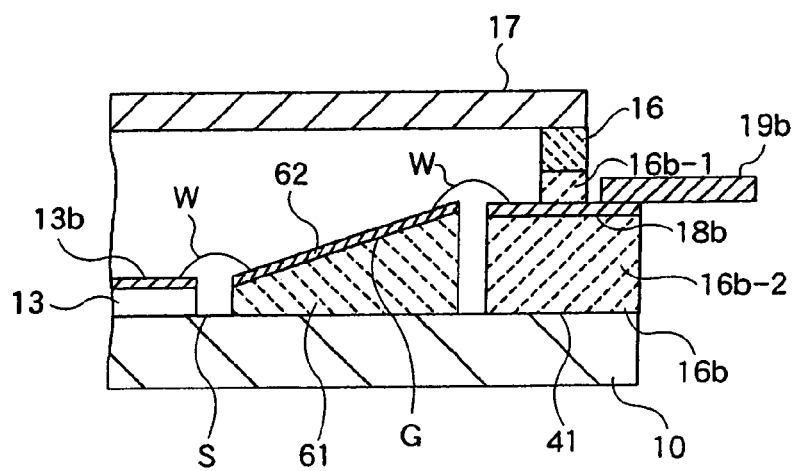
FIG. 6 is a cross sectional view showing a further different embodiment of the present invention.

The sixth embodiment of the present invention will be explained referring to FIG. 6. The semiconductor device of the embodiment has a substantially symmetric structure of the input and output side with respect to the semiconductor element (not illustrated), which is similar to the semiconductor device shown in FIG. 1. FIG. 6 is a cross section showing only the output portion of the semiconductor device. In this figure, parts corresponding to those of the semiconductor device shown in FIG. 1 are assigned with the same symbols and duplicated explanations are omitted.

In the embodiment, an insulator block 61 having an inclined surface G is provided on the base plate 10 between the second dielectric plate 13 and the band-shaped conductor 18b. The inclined surface G is low on the second dielectric plate 13 side and is high on the band-shaped conductor 18b side, with respect to a main surface S of the base plate 10. A second dielectric plate 62 is provided on the inclined surface G of the insulator block 61 and a line conductor pattern 63 is provided on the second dielectric plate.

Also in this case, the difference in the height between the circuits to be connected by the wire W is decreased and the similar advantages as the embodiment mentioned above can be obtained.

The invention claimed is:

1. A semiconductor device comprising:
    a metallic base plate;
    a semiconductor element arranged on the base plate,
    at least a first dielectric plate, arranged on the base plate, having a surface on which a circuit pattern is formed;
    a frame-shaped sidewall, provided on the base plate, surrounding the dielectric plate and the semiconductor element;
    a power supply portion including insulator forming a part of the sidewall;
    a band-shaped conductor provided at a higher position than the surface of the first dielectric plate with respect to a main surface of the base plate, wherein the conductor penetrates through the power supply portion; and
    a relay post provided on the dielectric plate;
    wherein the relay post includes: an insulator block, at a center portion of which a VIA hole is formed in a vertical direction; a VIA metal filled in the VIA hole, one end of which is connected to the circuit pattern and another end of which is extended to a higher position than the surface of the dielectric plate; and a conductor layer, provided on a surface of the insulator block, surrounding the VIA metal, and
    wherein the first band-shaped conductor is connected to the circuit pattern by an interconnection via the relay post.

2. A semiconductor device according to claim 1, wherein the semiconductor element is a semiconductor element for power amplification and the interconnection includes a wire.

3. A semiconductor device according to claim 1, wherein the semiconductor element includes a Gallium Arsenide field effect transistor.

4. A semiconductor device according to claim 1, wherein the power supply portion is so provided that a ceramic member is hermetically filled in a notch portion formed on the sidewall, and the band-shaped conductor is so provided as to penetrate through the ceramic member hermetically.

5. A semiconductor device according to claim 1, wherein a package is formed with the base plate, the frame-shaped sidewall provided on the base plate, and a metallic lid which closes an upper opening formed by the frame-shaped sidewall, which contains the semiconductor element, the first dielectric plate and a second dielectric plate.

6. A semiconductor device according to claim 5, wherein the inside of the package is formed hermetically.

* * * * *